(12) United States Patent
Ishizuka et al.

(10) Patent No.: US 7,593,201 B2
(45) Date of Patent: Sep. 22, 2009

(54) SEMICONDUCTOR INTEGRATED CIRCUIT

(75) Inventors: Hiroyasu Ishizuka, Ome (JP); Kazuo Tanaka, Hachioji (JP)

(73) Assignee: Renesas Technology Corp., Tokyo (JP)

( * ) Notice: Subject to any disclaimer, the term of this patent is extended or adjusted under 35 U.S.C. 154(b) by 327 days.

(21) Appl. No.: 11/253,635

(22) Filed: Oct. 20, 2005

(65) Prior Publication Data
US 2006/0087781 A1 Apr. 27, 2006

(30) Foreign Application Priority Data
Oct. 25, 2004 (JP) ............................ 2004-309960

(51) Int. Cl.
*H02H 3/22* (2006.01)
(52) U.S. Cl. ........................ 361/56; 361/111
(58) Field of Classification Search ............ 361/56, 361/91.1, 111; 257/355–360
See application file for complete search history.

(56) References Cited

U.S. PATENT DOCUMENTS

| | | | | |
|---|---|---|---|---|
| 5,508,548 | A | * | 4/1996 | Tailliet ........................ 257/360 |
| 5,821,804 | A | * | 10/1998 | Nikutta et al. ............... 327/382 |
| 6,392,860 | B1 | * | 5/2002 | Lin et al. ..................... 361/111 |
| 6,521,952 | B1 | * | 2/2003 | Ker et al. ..................... 257/360 |
| 6,728,086 | B2 | * | 4/2004 | Hung et al. ................... 361/56 |
| 6,828,842 | B2 | | 12/2004 | Saito et al. ................... 327/318 |
| 6,919,602 | B2 | * | 7/2005 | Lin et al. ..................... 257/360 |
| 7,085,113 | B2 | * | 8/2006 | Gauthier et al. ............... 361/56 |
| 7,106,568 | B2 | * | 9/2006 | Chen ......................... 361/91.1 |
| 2006/0274464 | A1 | * | 12/2006 | Chen ........................... 361/56 |

FOREIGN PATENT DOCUMENTS

JP 2004-14929 1/2004

OTHER PUBLICATIONS

People's Republic of China Office Action dated Feb. 6, 2009 for App. No. 200510114532.9.

* cited by examiner

*Primary Examiner*—Danny Nguyen
(74) *Attorney, Agent, or Firm*—Miles & Stockbridge P.C.

(57) ABSTRACT

A protection circuit with suppressed erroneous operation due to power source fluctuation has a first resistor and a capacitor connected in series between a power source line and a ground line, an inverter with an input connected between the first resistor and the capacitor, and a MOS transistor with a gate electrode that receives an output of the inverter and with a drain electrode and source electrode connected to the power source line and the ground line. When a high voltage fluctuation occurs in the power source line, a level change at a connection point between the first resistor and the capacitor is delayed according to a time constant. By the delay, the MOS transistor that receives an output of the inverter is temporarily turned on and discharges a high voltage to the ground line.

10 Claims, 9 Drawing Sheets

SEMICONDUCTOR INTEGRATED CIRCUIT

CROSS-REFERENCE TO RELATED APPLICATION

The present application claims priority from Japanese patent application No. 2004-309960 filed on Oct. 25, 2004, the content of which is hereby incorporated by reference into this application.

BACKGROUND OF THE INVENTION

The present invention relates to a protection circuit for suppressing destruction of an internal circuit by fluctuations in high voltage due to electrostatic discharge (ESD) for an input terminal and a power source terminal in a semiconductor integrated circuit.

Japanese Patent Laid-open No. 2004-14929 (FIG. 1, paragraph 0060) discloses a protection circuit against the ESD having a configuration including a resistive element and a capacitive element connected in series between a power source line and a ground line, a CMOS inverter whose input is connected between the resistive element and the capacitive element, and an n-channel type clamp MOS transistor whose gate electrode receives an output of the CMOS inverter and whose drain electrode and source electrode are connected to the power source line and the ground line. In a normal state, an output of the CMOS inverter is set to the low level, and the clamp MOS transistor is set to an off state. When fluctuations in high voltage caused by the ESD occur in the power source line, a level change at the connection point between the resistive element and the capacitive element is delayed according to the time constant, rise of the input level of the CMOS inverter is delayed from rise in the level on the operation power source side of the CMOS inverter, thereby setting an output of the CMOS inverter to the high level for a predetermined period. Only in the period, the clamp MOS transistor is set to the on state, and high voltage of the power source line is allowed to escape to the ground line.

SUMMARY OF THE INVENTION

The inventors of the present invention examined the protection circuit. First, it was clarified by the inventors herein that an output of the CMOS inverter excessively reacts to power source noise, an input of the gate of the clamp MOS transistor becomes unstable, and there is the possibility that a leak occurs in the clamp MOS transistor. Such a leak causes waste power consumption.

Second, reduction in the area by improving the operation of the clamp circuit was examined. The larger the size of the clamp MOS transistor is, the more the speed of clamping operation of the protection circuit, that is, the speed of decreasing high voltage by the clamp MOS transistor increases and, accordingly, the area enlarges. It is effective to dispose protection circuits as many as possible within the area. Therefore, it was clarified that improvement in clamp speed without increasing the area is effective at preventing a semiconductor integrated circuit from being destroyed by fluctuations in high voltage.

Third, the necessity of lowering the clamp voltage as the voltage of the semiconductor integrated circuit decreases was examined.

An object of the invention is to provide a semiconductor integrated circuit in which an erroneous operation in a protection circuit caused by relatively small power fluctuations such as power source noise is suppressed.

Another object of the invention is to provide a semiconductor integrated circuit realizing reduction in the area of the protection circuit by improving the speed of clamping operation of the protection circuit.

Further another object of the invention is to provide a semiconductor integrated circuit realizing a lower clamp voltage of the protection circuit.

The above and other objects and novel features of the invention will become apparent from the description of the specification and the appended drawings.

An outline of typical inventions disclosed in the application will be briefly described as follows.

[1] A semiconductor integrated circuit according to the invention has a protection circuit which operates when a potential difference between a power source line (3) as a first line and a ground line (4) as a second line becomes a predetermined value or larger, that is, a protection circuit against a fluctuation in high voltage between the power source line (3) and the ground line (4). The protection circuit has a first resistor (10) as a resistive element and a capacitor (11) as a capacitive element connected in series between the power source line and the ground line, an inverter (12) whose input is connected between the first resistor and the capacitor, and a MOS transistor (13) having a gate electrode that receives an output of the inverter and a drain electrode and a source electrode which are connected to the power source line and the ground line, and the gate electrode of the MOS transistor is connected to the ground line via a second resistor (14) as a second resistive element.

In a normal state, the MOS transistor having the gate which receives an output of the inverter is set to the off state. When a fluctuation in high voltage caused by ESD or the like is transmitted to the power source line, the level on the operation power source side of the inverter directly changes so as to follow application of the high voltage but a level change at the connection point (N3) between the first resistor and the capacitor is delayed in accordance with the time constant. By the delay, the MOS transistor which receives an output of the inverter is set to the on state for a predetermined period, and the high voltage on the power source line is released to the ground line. After that, the MOS transistor is reset to the off state as the normal state. If the level of the ground line floats or the level of the power source line drops due to power source noise when the MOS transistor is in the off state, a level change at the connection point between the first resistor and the capacitor is delayed according to the time constant from a change in the operation power source of the inverter. When an output of the inverter thereby fluctuates, there is the possibility that an undesired current flows in the MOS transistor. Since an output of the inverter is pulled down to the ground line via the second resistor by this time, when the output of the inverter fluctuates undesirably, fluctuation in the gate input of the MOS transistor can be suppressed.

[2] As a concrete mode of the invention, the gate electrode of the MOS transistor is connected to the substrate region in which the MOS transistor is formed. One of currents flowing in the MOS transistor at the time of releasing the high voltage on the power source line to the ground line is a channel current that responds to the gate input. Further, attention is paid to parasitic bipolar transistors in the MOS transistor. The parasitic bipolar transistor turns on when a potential difference of a forward voltage (VF) or large is created between the substrate region such as a well region in which the MOS transistor is formed and the source. By the means, the gate electrode of the MOS transistor is connected to the base region in which the MOS transistor is formed. Therefore, when the channel current starts flowing into the MOS transistor in response to the gate input, the current by the on operation of the parasitic bipolar transistor also flows between the source and the drain, and the speed of the operation (clamping operation) of applying a high voltage to the ground line can be also increased.

[3] As another concrete mode of the invention, the semiconductor integrated circuit of [1] further includes another inverter (40) whose input is connected between the first resistor and the capacitor. An output of the another inverter is connected to the substrate region in which the MOS transistor is formed, and an output of the another inverter is connected to the ground line via a third resistor (41). When the gate input of the MOS transistor (13) is directly connected to the substrate region in the MOS transistor, the gate input at the time of turning on the MOS transistor (13) decreases only by an amount of the forward voltage (VF), and the gate input of the MOS transistor 13 cannot be swung fully. At this time, by performing the gate input to the MOS transistor and biasing of the substrate region by inverters (12 and 40) which are different from each other, the gate input used at the time of turning on the MOS transistor can be swung fully. As a result, it can contribute to increase in the speed of the clamping operation.

[4] As further another concrete mode of the invention, in the semiconductor integrated circuit [1], a thyristor (50) having an anode and a cathode connected between the power source line and the ground line and having a trigger electrode connected to the gate electrode of the MOS transistor is disposed. The MOS transistor (51) also functions for trigger to operate the thyristor. An initial clamping operation of releasing high voltage is performed by the MOS transistor (51). The main clamping operation is performed by the thyristor (50). The gate electrode of the MOS transistor is connected to the trigger electrode of the thyristor, and the substrate region such as the well region of the MOS transistor is connected to the gate electrode and biased. In contrast to a voltage (turn-on voltage) applied across the anode and the cathode for turning on the thyristor, it is sufficient that a voltage to be applied to the trigger electrode to thereby turn on the thyristor is higher than a hold voltage (the minimum voltage for maintaining the turn-on state of the thyristor) to a certain extent. The normal power source voltage has to be lower than the hold voltage for the reason that the thyristor has to be turned off after clamping the high voltage. When high voltage generated by ESD or the like is applied, the channel current that responds to the gate input and the channel current by the parasitic bipolar transistor start flowing in the MOS transistor (51). The current acts on the trigger electrode of the thyristor and turns on the thyristor, and the high voltage generated by ESD or the like is passed from the power source line to the ground line also by the thyristor. In the protection circuit with the configuration, the power source voltage supplied to the power source line in the normal state has to be lower than the hold voltage of the thyristor. Therefore, the invention is applied to a semiconductor integrated circuit of a low voltage power source, in which the power source voltage is lower than the hold voltage of the thyristor. With the technique, the speed of the clamping operation for fluctuations in high voltage in a semiconductor integrated circuit with a low-voltage power source can be increased.

[5] A semiconductor integrated circuit according to another aspect of the invention has a protection circuit against a fluctuation in high voltage between a power source line and a ground line. The protection circuit has a first resistor and a capacitor connected in series between the power source line and the ground line, an inverter whose input is connected between the first resistor and the capacitor, and a MOS transistor having a gate electrode that receives an output of the inverter and a drain electrode and a source electrode which are connected to the power source line and the ground line. The gate electrode of the MOS transistor is connected to a substrate region in which the MOS transistor is formed. By biasing the substrate region of the clamp MOS transistor by the gate, as described above, the channel current that responds to the gate input and also the current by the operation of turning on the parasitic bipolar transistor also flow between the source and the drain in the MOS transistor, so that the clamping operation can be performed at higher speed.

[6] A semiconductor integrated circuit according to another aspect of the invention has a protection circuit against a fluctuation in high voltage between a power source line and a ground line. The protection circuit includes: a first resistor and a capacitor connected in series between the power source line and the ground line; a first inverter whose input is connected between the first resistor and the capacitor; a MOS transistor having a gate electrode that receives an output of the inverter and a drain electrode and a source electrode which are connected to the power source line and the ground line; and a second inverter whose input is connected between the first resistor and the capacitor and whose output is connected to a substrate region in which the MOS transistor is formed. As described above, by performing the gate input to the MOS transistor and the biasing of the substrate region by inverters which are different from each other, the gate input performed at the time of turning on the MOS transistor can be swung fully. As a result, it can contribute to increase in the speed of the clamping operation.

[7] A semiconductor integrated circuit according to another aspect of the invention has a protection circuit against a fluctuation in high voltage between a power source line and a ground line. The protection circuit includes: a first resistor and a capacitor connected in series between the power source line and the ground line; an inverter whose input is connected between the first resistor and the capacitor; a MOS transistor having a gate electrode that receives an output of the inverter and a drain electrode and a source electrode which are connected to the power source line and the ground line; and a thyristor having an anode and a cathode which are connected between the power source line and the ground line and a trigger electrode which is connected to the gate electrode of the MOS transistor. As described above, the clamping operation for fluctuations in high voltage can be performed at higher speed in the semiconductor integrated circuit with a low-voltage power source.

[8] The protection circuit is disposed between the power source line (3) near an external power source pad (5) and a ground line (4) near an external ground pad (6) in order to absorb the high voltage caused by fluctuations in high voltage around external terminals of the semiconductor integrated circuit. The predetermined circuit module is a circuit module in which, for example, a wiring resistor to an external ground pad is connected to a relatively large ground line. The protection circuit is disposed near each of a plurality of predetermined circuit modules (70 and 71) and between the power source line and the ground line, so that even if high voltage is applied to the inside of the semiconductor integrated circuit, the high voltage can be absorbed just before the internal circuit module. The protection circuit is disposed between a power source line of an internal power source voltage (VCC1 and VCC2) generated on the basis of an external power source voltage and the ground line so that the high voltage which reaches the power source line of the internal power source voltage can be also released. The semiconductor integrated circuit further includes an input protection circuit (30) against a fluctuation in high voltage between an external input/output pad (33) and an input circuit (39) so that the input circuit can be prevented from being destroyed by the high voltage applied to the external input/output pad.

Effects obtained by representative ones of the inventions disclosed in the application will be briefly described as follows.

By short-circuiting the gate of the clamp MOS transistor and the ground line with high resistance, the clamping operation of the protection circuit can be prevented from being erroneously performed by power source noise.

By biasing the substrate region of the clamp MOS transistor on the basis of the voltage at the connection node of the resistor and the capacitor connected in series between the power source line and the ground line, the invention can contribute to decrease the clamp voltage and increase the speed of the clamping operation.

By employing the thyristor and the MOS transistor in parallel in the final stage of the clamp circuit, the speed of the clamping for high voltage fluctuations in the semiconductor integrated circuit which is operated with low voltage can be increased.

DESCRIPTION OF THE PREFERRED EMBODIMENTS

Gate Bias and Well Bias for Clamp MOS Transistor

Figure 1:
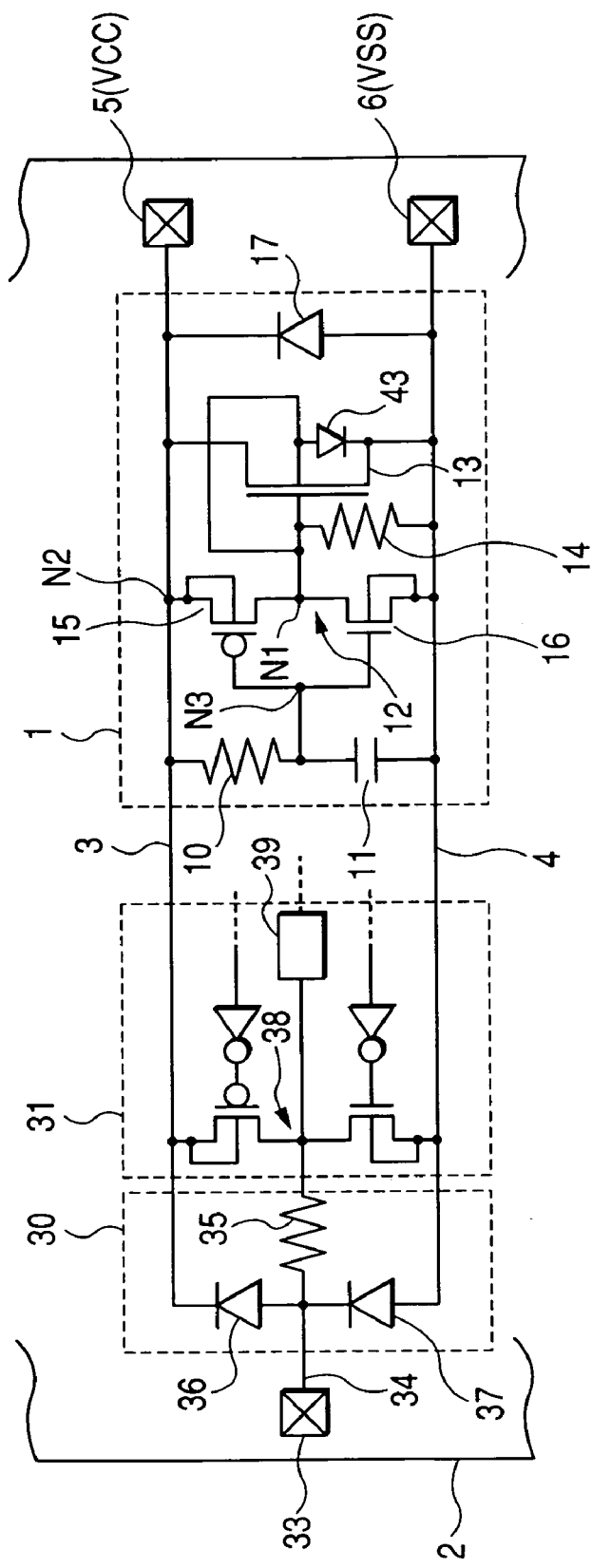
FIG. 1 is a circuit diagram showing an example of a protection circuit performing both of gate bias and well bias on a clamp MOS transistor.

FIG. 1 shows an example of a protection circuit of a semiconductor integrated circuit according to the present invention. A protection circuit 1 shown in the diagram is mounted on a semiconductor integrated circuit 2 such as a logic LSI, a memory LSI, or the like of a microcomputer or the like formed by the CMOS integrated circuit manufacturing technique on a single semiconductor substrate such as a single crystal silicon. The protection circuit 1 is disposed between a power source line 3 as a first line and a ground line 4 as a second line and, in response to an application of a high voltage by ESD or the like, functions to make the high voltage escape from one end to the other end. In the embodiment, the power source line 3 serves as a power source main line connected to an external power source pad 5, and the ground line 4 serves as a ground main line connected to an external ground pad 6. A power source voltage VCC is supplied to the external power source pad 5, and a ground voltage VSS of the circuit is supplied to the ground pad 6.

The protection circuit 1 has a first resistor 10 and a capacitor 11 connected in series between the power source line 3 and the ground line 4, a CMOS inverter 12 whose input is connected between the first resistor 10 and the capacitor 11, and an n-channel type clamp MOS transistor 13 whose gate electrode receives an output of the CMOS inverter 12 and whose drain electrode and source electrode are connected to the power source line 3 and the ground line 4. The gate electrode of the clamp MOS transistor 13 is connected to the ground line 4 via a second resistor 14. The CMOS inverter 12 is constructed by a p-channel type MOS transistor 15 and an n-channel type MOS transistor 16. A diode 17 is connected between the power source line 3 and the ground line 4. The resistor 10 can take the form of a MOS resistor (which can be constructed by making the gate of a p-channel type MOS transistor always on), a well, a diffusion layer, a polysilicon resistor, or the like. The capacitor 11 can be constructed by a MOS capacitor, a wiring capacitor, or the like.

The time constant obtained by the first resistor 10 and the capacitor 11 is about 200 nanoseconds to 400 nanoseconds in consideration of the impulse of a surge caused by ESD. Specifically, as ESD testing methods for a semiconductor integrated circuits, testing methods using HBM (Human Body Model), MM (Machine Model), and CDM (Charged Device Model) are known. The BM testing method is a method of simulating a waveform in the case where static built up on a human is emitted to a semiconductor integrated circuit. The MM testing method is a method of simulating a waveform in the case where static built up on a machine is emitted to a semiconductor integrated circuit. The CDM testing method is a method of simulating a state where static built up on a package of a semiconductor integrated circuit is released. In consideration of the discharge models, the time constant is determined so that a potential difference occurs between the power source potential of the CMOS inverter 12 (the source potential of the MOS transistor 15) and an input potential at the time of application of a high voltage by ESD. For example, the first resistor 10 is set to 100 kΩ and the capacitor 11 is set to 10 picofarads (pF). The second resistor 14 biases the gate voltage of the MOS transistor 13 to the ground potential of the circuit and is set to high resistance such as 100 kΩ.

The first resistor 10 can be constructed by a MOS transistor. For example, in the case of constructing the first resistor 10 by an n-channel type MOS transistor, by connecting the gate electrode to the power source line 3, it can be operated as a resistive element. In the case of constructing the first resistor 10 by a p-channel type MOS transistor, by connecting the gate electrode to the ground line 4, it can be operated as a resistive element. In such a manner, by constructing the first resistor 10 by a MOS transistor, the layout area of the resistor 10 and, moreover, the layout area of the protection circuit 1 can be reduced. Similarly, the second resistor 14 can be also constructed by a MOS transistor. Further, the capacitor 11 can be also constructed by using a MOS transistor or the like.

Figure 2:
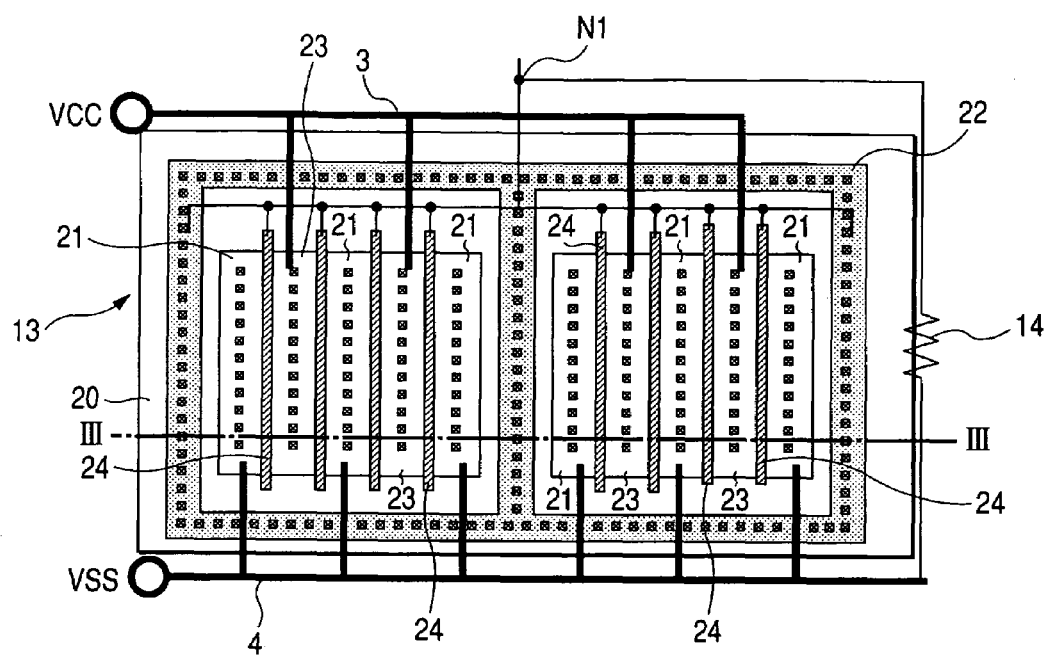
FIG. 2 is a plan view of a device structure of the clamp MOS transistor in the protection circuit of FIG. 1.
Figure 3:
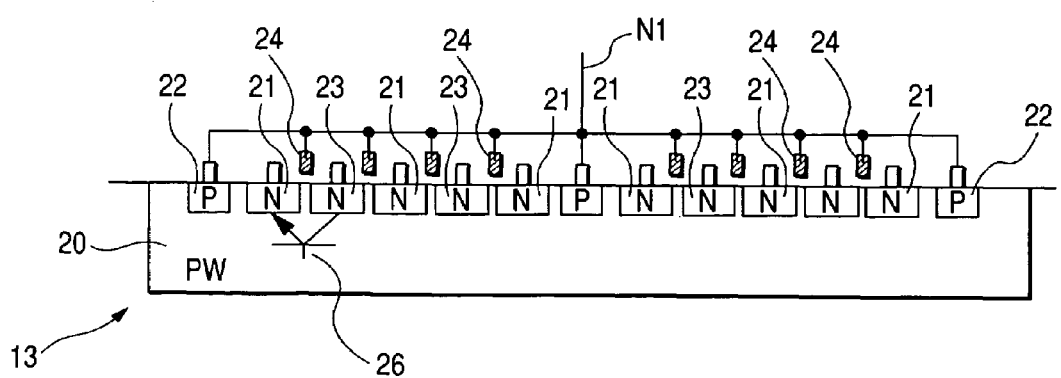
FIG. 3 is a vertical section taken along line III-III of FIG. 2.

FIG. 2 is a plan view showing a device structure of the MOS transistor 13 in the protection circuit 1. FIG. 3 is a cross section taken along line III-III of FIG. 2. Reference numeral 20 denotes a p-type well region (PW), reference numerals 21 and 23 denote n-type semiconductor regions (N), reference numeral 22 indicates a p-type semiconductor region (P), and reference numeral 24 indicates a polysilicon layer as a component of the gate electrode. The semiconductor region 23 serves as the drain electrode of the MOS transistor 13, and the semiconductor region 21 serves as the source electrode of the MOS transistor 13. The drain electrode is connected to the power source line 3 via a contact, and the source electrode is connected to the ground line 4 via a contact. The p-type semiconductor region 22 is provided so as to surround the n-type semiconductor region 21 and supplies the gate voltage of the MOS transistor 13 to the well region 20. The gate electrode of the MOS transistor 13 is connected to the ground line 4 from a node N1 via the second resistor 14. The second resistor 14 can be constructed by, for example, a well resistor. Specifically, the ground line 4 is connected to the well region 20 via a not-shown contact. For example, the connection point is positioned on the outside of the p-type semiconductor region 22.

Figure 4:
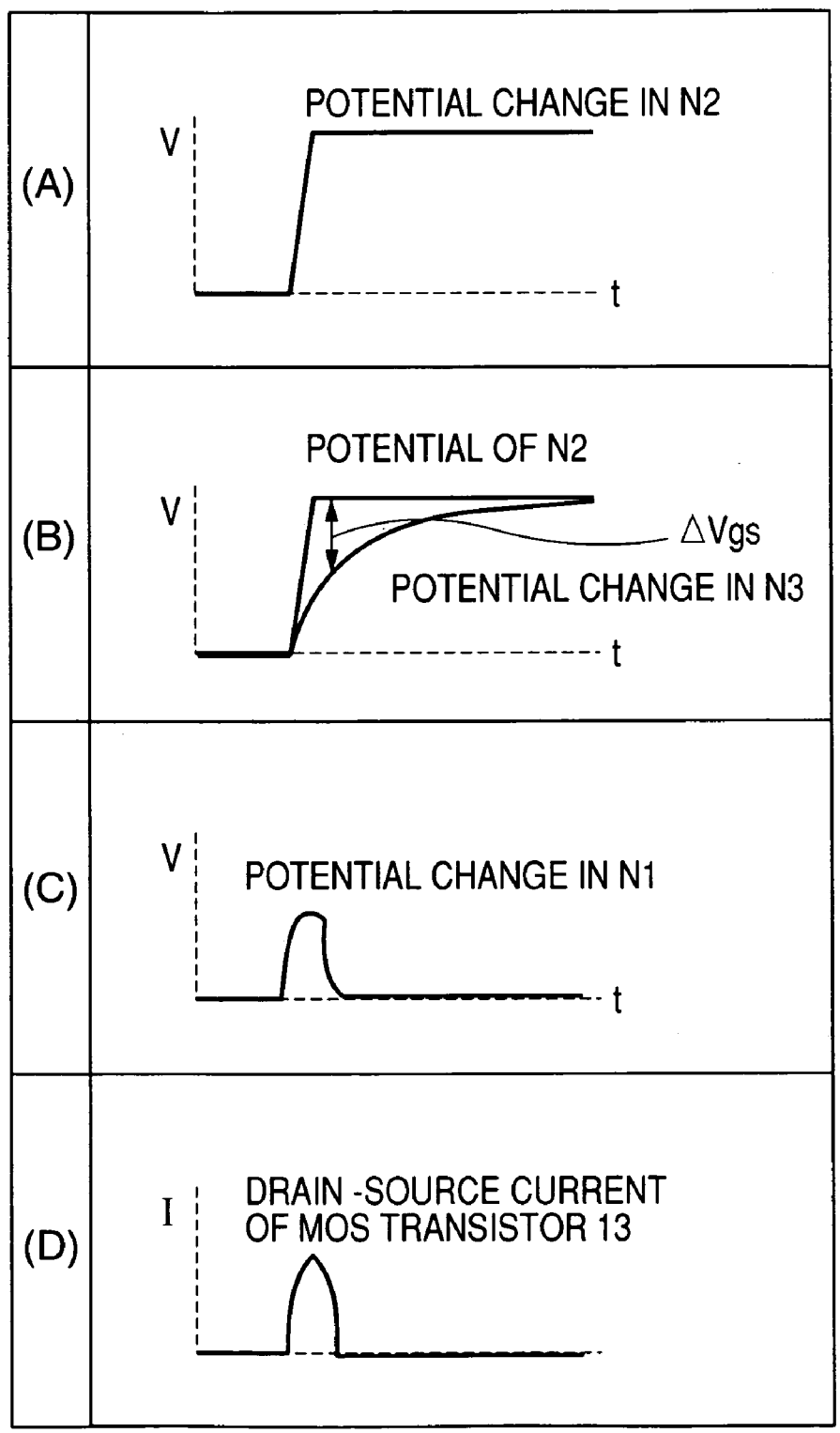
FIG. 4 is a diagram illustrating operations of the protection circuit.

The operation of the protection circuit 1 will be described. In a normal state where no high voltage is applied to the power source line 3 and the ground line 4, the clamp MOS transistor 13 which receives an output of the inverter 12 by its gate is set to an off state. When a high voltage generated by the ESD is applied to the ground line 4, the parasitic diode 17 in the clamp MOS transistor 13 is turned on and the high voltage escapes to the power source line 3. When a high voltage generated by the ESD is applied to the power source line 3, the level at an operation power source node N2 of the inverter linearly changes so as to follow the application of the high voltage (A in FIG. 4). At this time, a level change at a connection point (node N3) between the first resistor 10 and the capacitor 12 is delayed according to the time constant (B in FIG. 4). The delay causes a temporal potential difference (Vgs) between the gate and the source of the p-channel type MOS transistor 15 as a component of the inverter 12, so that the MOS transistor 15 is turned on. In response to the turn-on, the level at the node N1 temporarily changes from the low level to the high level (C in FIG. 4). In association with the change in the gate potential of the node N1, the MOS transistor 13 is turned on, and the high voltage on the power source line 3 is released to the ground line 4 (D in FIG. 4). After that, the MOS transistor 13 is reset to the off state as the normal state. If the level of the ground line 4 floats or the level of the power source line 3 drops due to power source noise when the MOS transistor 13 is in the off state, a level change at the connection point between the first resistor 10 and the capacitor 11 is delayed according to the time constant from a change in the operation power source of the inverter 12. When an output of the CMOS inverter 12 thereby fluctuates, there is the possibility that an undesired current flows in the MOS transistor 13. Since an output of the CMOS inverter 12 is pulled down to the ground line 4 via the second resistor 14 by this time, when the output of the CMOS inverter 12 fluctuates undesirably, fluctuation in the gate input of the MOS transistor 13 can be suppressed.

The gate electrode of the MOS transistor 13 is connected to the well region 20 in which the MOS transistor 13 is formed. One of currents flowing in the MOS transistor 13 at the time of releasing the high voltage on the power source line 3 to the ground line 4 is a channel current that responds to the gate input. Further, attention is paid to parasitic bipolar transistors (one of which is referred to by reference numeral 26 in FIG. 3) in the MOS transistor 13. The parasitic bipolar transistor 26 turns on when a potential difference of a forward voltage (VF) or large is created between the well region 20 in which the MOS transistor 13 is formed and the source region (semiconductor region 21). As described above, the gate electrode of the MOS transistor 13 is connected to the well region 20 in which the MOS transistor 13 is formed. Therefore, when the channel current flows in the MOS transistor 13 by the gate input, the current by the on operation of the parasitic bipolar transistor 26 also flows between the source and the drain, and the speed of the operation (clamping operation) of applying a high voltage to the ground line 4 can be also increased.

Figure 5:
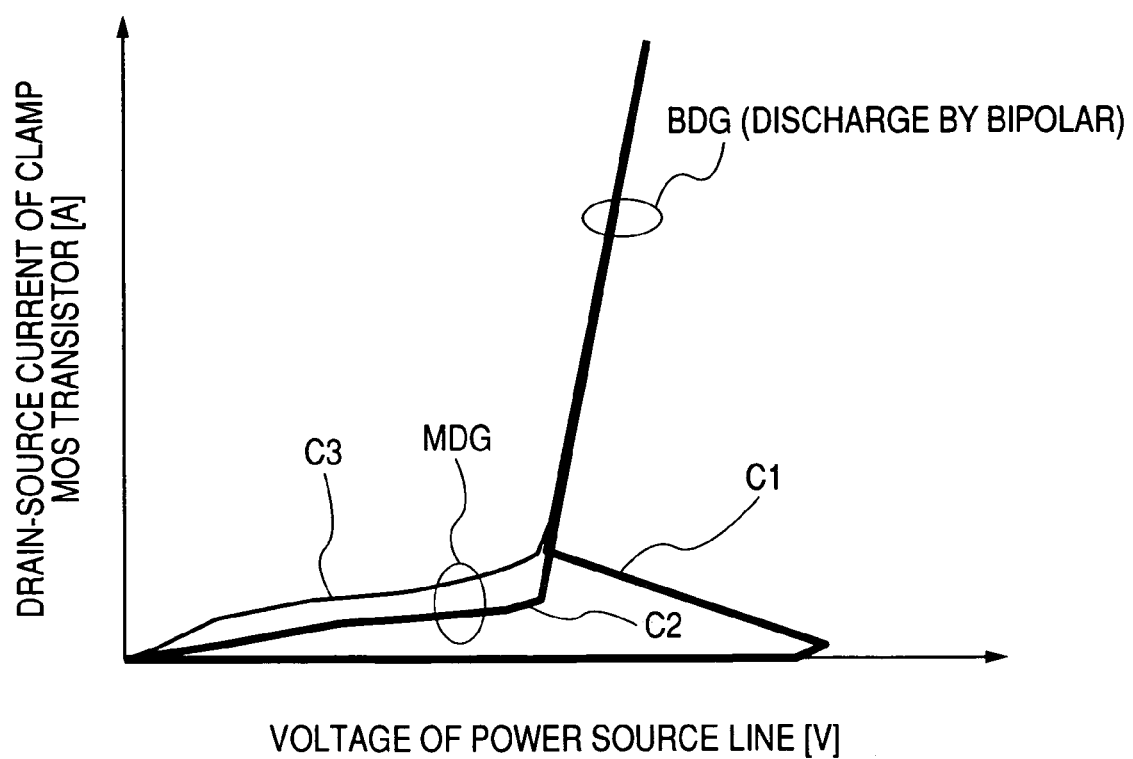
FIG. 5 is a characteristic diagram illustrating the discharge characteristic obtained by the gate bias and the well bias on the clamp MOS transistor.

FIG. 5 shows characteristics obtained by the gate bias and the well bias on the clamp MOS transistor 13. The vertical axis indicates the drain-source current in the clamp MOS transistor 13 and the horizontal axis indicates voltage of the power source line. C1 indicates a characteristic obtained when a circuit form (not shown) in which the gate of the clamp MOS transistor 13 is fixed to the source, C2 indicates a characteristic obtained when an output of the CMOS inverter 12 is supplied to the gate of the clamp MOS transistor 13, and C3 denotes a characteristic obtained when the well region in the clamp MOS transistor 13 is biased with a gate voltage. The main discharge in the clamping operation at BDG is a bipolar discharge by a parasitic bipolar, and the main discharge in the clamping operation at MDG is a MOS current discharge by channel current in the MOS transistor 13. For example, when the high voltage (high voltage surge) generated by ESD is 5.5V or lower, the high voltage surge is discharged mainly by the channel current of the clamp MOS transistor 13. When the high voltage (high voltage surge) generated by ESD is 5.5V or higher, the high voltage surge is discharged mainly by the parasitic bipolar transistor 26 together with the channel current of the clamp MOS transistor 13.

In FIG. 1, separately from the protection circuit 1, an input protection circuit 30 is provided. To be specific, in the example of FIG. 1, a diffused resistor 35 is disposed on a signal path 34 extended from input/output terminals of an input/output buffer 31 to an external input/output pad 33. A positive high voltage applied to the external input/output pad 33 by ESD is released to the power source line 3 via a diode 36, and a negative high voltage applied to the external input/output pad 33 is released to the ground line 4 via a diode 37. The input/output buffer 31 has an output inverter 38 and an input circuit 39.

As described above, by short-circuiting the gate electrode of the clamp MOS transistor 13 and the ground line as a low-voltage-side power source via the resistor 14, the gate voltage of the clamp MOS transistor 13 can be always maintained at the low level like a DC voltage. Consequently, the circuit can be controlled so as to operate in response to a large voltage fluctuation such as an ESD surge on the high-voltage power source side and so as not to operate in response to an ignorable small voltage fluctuation (for example, noise in the power source). In such a manner, the usability of a semiconductor integrated circuit product can be improved. For example, a product operation margin resistance to noise which occurs in a product, a substrate, and a system can be improved. In short, an ESD protection circuit does not erroneously operate in response to small noise. A feed-through current value at the turn-on of the power source can be reduced. By biasing the well region 20 with the gate input of the clamp MOS transistor 13 at the final stage in the protection circuit 1, when a voltage of an undesirable level (for example, ESD surge) is applied across a high-potential-side power source (power source line 3) and a low-potential-side power source (ground line 4), the well and the source are forward-biased, and the voltage across the high-potential-side power source and the low-potential-side power source can be promptly clamped by the discharge by the channel current of the clamp MOS transistor 13 and the discharge by the operation of the parasitic bipolar transistor between the drain and source.

As a modification of the protection circuit 1 shown in FIG. 1, a configuration obtained by eliminating the n-channel type MOS transistor 16 may be also employed. In this case, the number of circuit elements in the protection circuit 1 can be reduced, so that the layout area can be reduced. As another modification of the protection circuit 1 shown in FIG. 1, a configuration obtained by eliminating the n-channel type MOS transistor 16 and disconnecting the gate electrode of the n-channel type MOS transistor 13 and the well region 20 may be also employed.

Separation Between Gate Bias Path and Well Bias Path for clamp MOS Transistor

Figure 6:
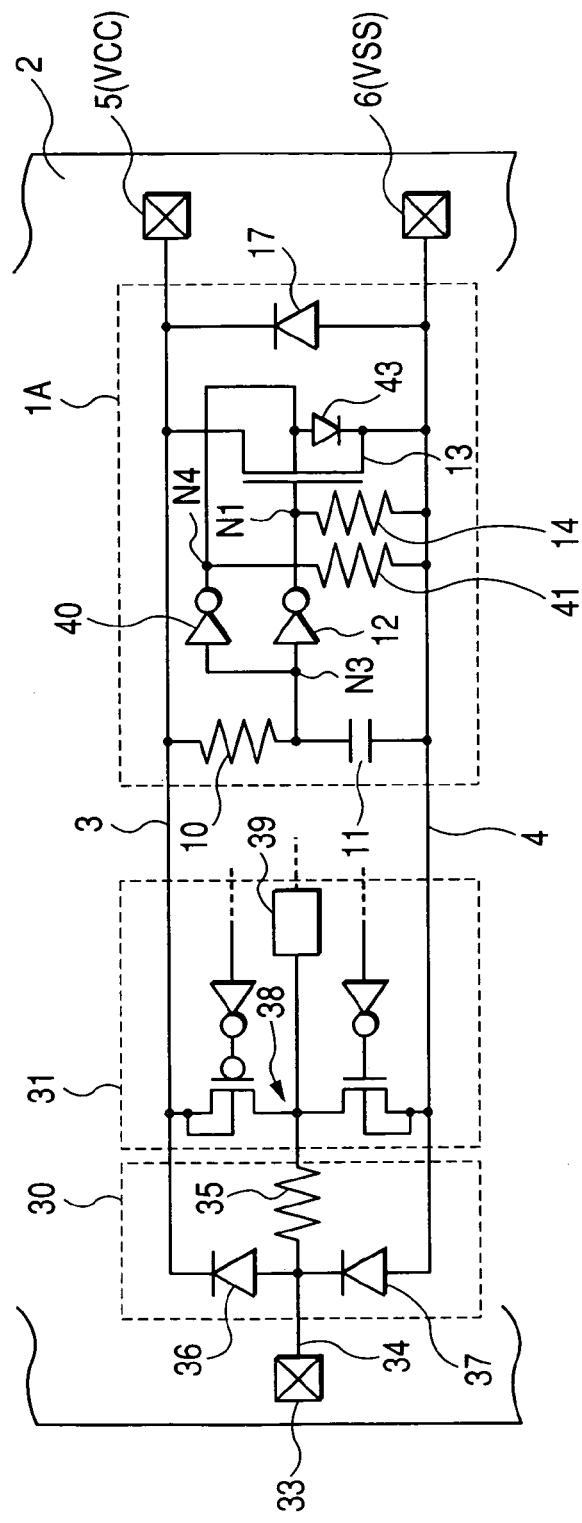
FIG. 6 is a circuit diagram illustrating another protection circuit in which the path of the gate bias and the path of the well bias on the clamp MOS transistor are separated.

FIG. 6 shows another example of the protection circuit. A protection circuit 1A shown in FIG. 6 is different from FIG. 1 with respect to the point that a gate bias path and a well bias path for the clamp MOS transistor 13 are separated from each other. Specifically, another CMOS inverter 40 whose input is connected between the first resistor 10 and the capacitor 11 is provided, an output of the CMOS inverter 40 is connected to the well region in which the clamp MOS transistor 13 is formed, and an output of the CMOS inverter 40 is connected to the ground line 4 via a third resistor 41. An output of the CMOS inverter 12 is connected to the gate of the clamp MOS transistor 13 and also connected to the ground line 4 via the second resistor 14.

As described in FIG. 1, when the gate input of the clamp MOS transistor 13 is directly connected to the well region 20 of the MOS transistor 13, due to the action of a parasitic diode 43 formed in a joint portion between the well region 20 of the MOS transistor 13 and the source, the level of the gate input at the time of turning on the MOS transistor 13 drops only by the amount of the forward voltage (VF) of the parasitic diode 43, and the gate input of the MOS transistor 13 cannot be swung fully. At this time, by performing the gate input on the MOS transistor 13 and biasing of the well region 20 by the CMOS inverters 12 and 40 which are different from each other, the gate input performed at the time of turning on the clamp MOS transistor 13 can be swung fully. As a result, it can contribute to increase in the speed of the clamping operation. Since the other operations of the protection circuit 1A are similar to those of the configuration of FIG. 1, the detailed description will not be repeated here.

Figure 7:
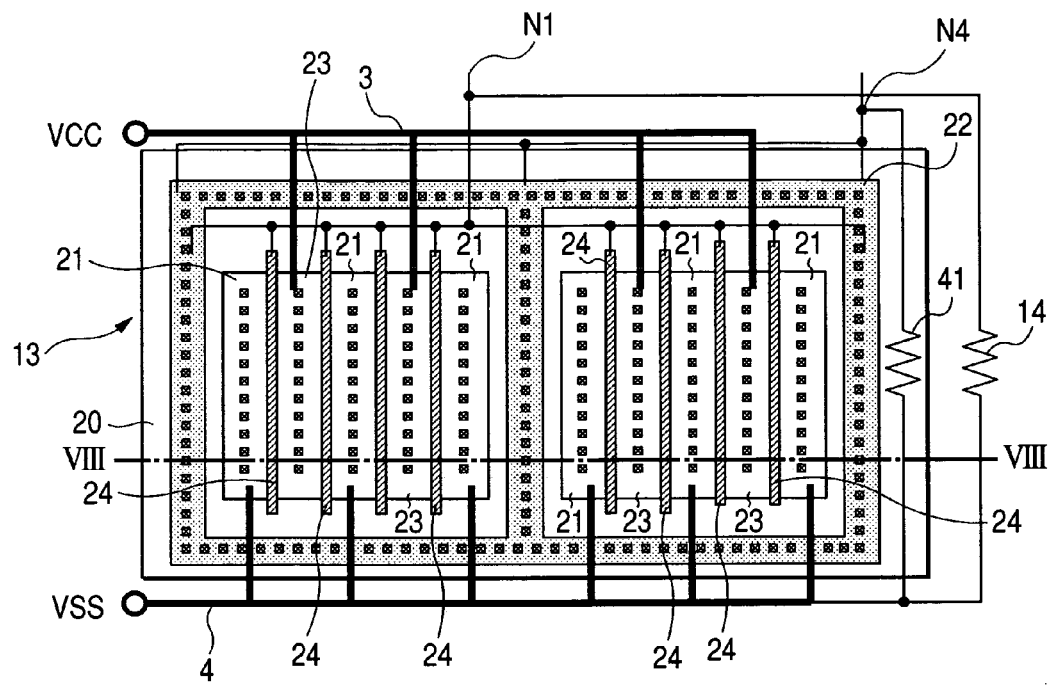
FIG. 7 is a plan view of a device structure of an MOS transistor in the protection circuit of FIG. 6.
Figure 8:
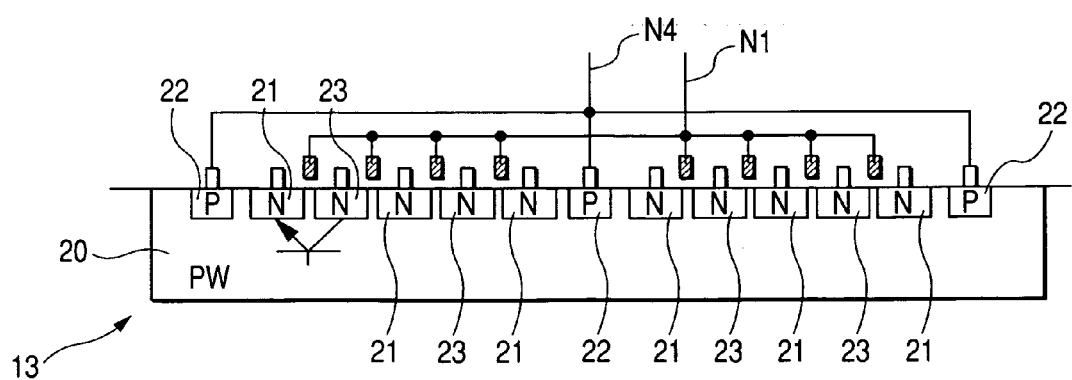
FIG. 8 is a cross section taken along the line VIII-VIII of FIG. 7.

FIG. 7 is a plan view showing a device structure of the MOS transistor 13 in the protection circuit 1. FIG. 8 is a schematic cross section taken along line VIII-VIII of FIG. 7. The same reference numerals are given to components which are the same as those in FIGS. 2 and 3 and their detailed description will not be repeated. The third resistor 41 may be also constructed by using a well resistor like the second resistor 14, a diffusion layer resistor, or a polysilicon resistor.

Particularly, the protection circuit 1A in FIG. 6 is provided with the well bias circuit 40 independent of the gate bias for the clamp MOS transistor 13. Consequently, the gate of the clamp MOS transistor 13 for discharge at the final stage can be swung fully, so that the invention is effective for a device having low parasitic bipolar discharge capability.

As a modification of the protection circuit 1A shown in FIG. 6, a protection circuit having a configuration obtained by eliminating the n-channel type MOS transistor out of the p-channel type MOS transistor and the n-channel type MOS transistor constructing the CMOS inverter 12 may be also employed. Also in this case, the number of circuit elements of the protection circuit 1A can be reduced, so that the layout area can be reduced.

The first resistor 10 can be constructed by a MOS transistor. For example, in the case of constructing the first resistor 10 by an n-channel type MOS transistor, by connecting the gate electrode to the power source line 3, it can be operated as a resistive element. In the case of constructing the first resistor 10 by a p-channel type MOS transistor, by connecting the gate electrode to the ground line 4, it can be operated as a resistive element. In such a manner, by constructing the first resistor 10 by a MOS transistor, the layout area of the resistor 10 and, moreover, the layout area of the protection circuit 1 can be reduced. Similarly, each of the second resistor 14 and the third resistor 41 can be also constructed by a MOS transistor. Further, the capacitor 11 can be also constructed by using a MOS transistor or the like.

Protection Circuit Using Thyristor as Discharge Element

Figure 9:
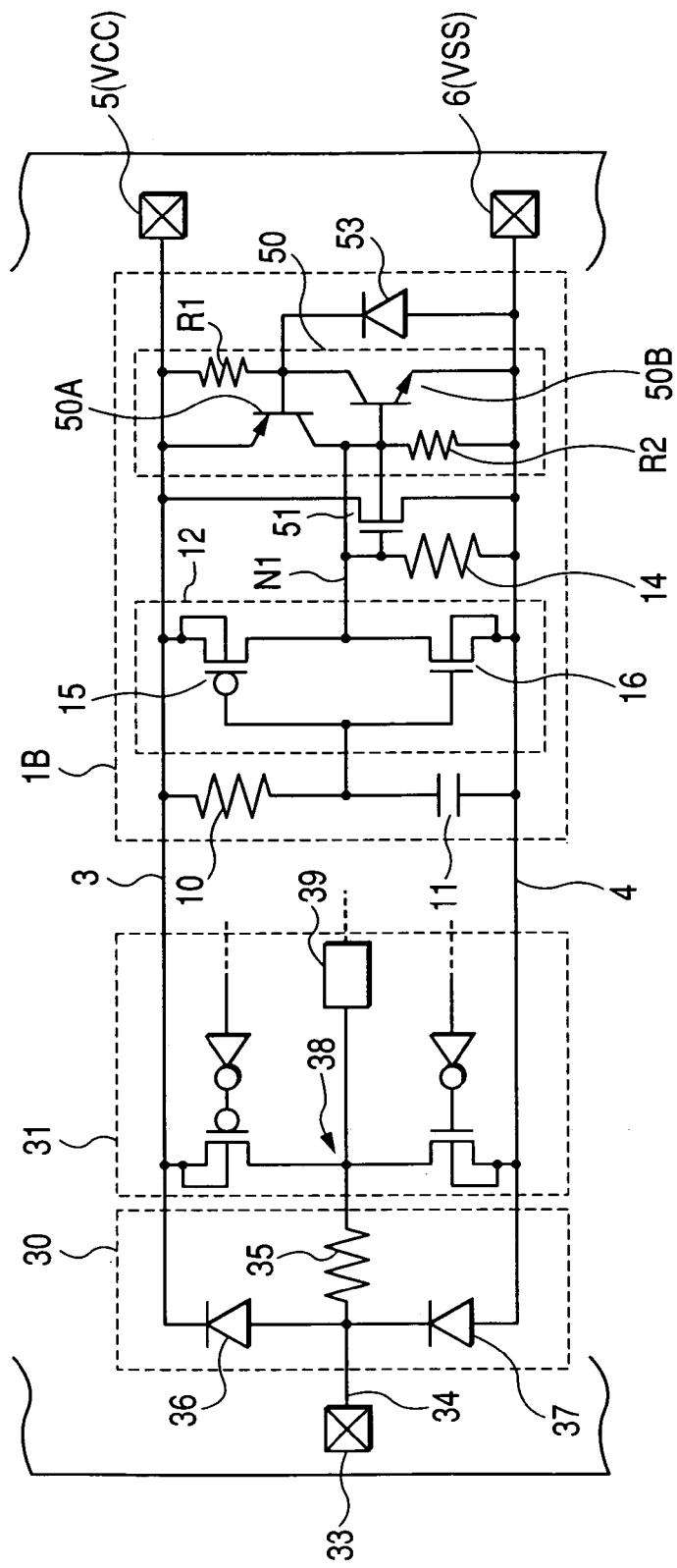
FIG. 9 is a cross section illustrating further another protection circuit using a thyristor as a discharge element.

FIG. 9 shows further another example of the protection circuit. A protection circuit 1B shown in FIG. 9 employs a thyristor 50 in parallel with a clamp MOS transistor 51 as a discharge element, and the MOS transistor 51 is also used for driving a trigger electrode of the thyristor 50. The thyristor 50 whose anode and cathode are connected between the power source line 3 and the ground line 4 and whose trigger electrode is connected to the gate electrode of the MOS transistor 51 is disposed. The thyristor 50 is constructed by a PNP bipolar transistor 50A and an NPN bipolar transistor 50B. The gate of the MOS transistor 51 is connected to an output of the CMOS inverter 12 in a manner similar to the above and is connected to the ground line 4 via the second resistor 14. The MOS transistor 51 is used not only for clamping but also for a trigger operation which turns on the thyristor. The size of the MOS transistor 51 may be the same or smaller than that of the clamp MOS transistor 13. An initial operation of releasing the high voltage is performed by the MOS transistor 51, and a main clamping operation is performed by the thyristor 50. The gate electrode of the MOS transistor 51 is connected to the trigger electrode of the thyristor 50, and the well region of the MOS transistor 51 is connected to the gate electrode and biased. Reference numeral 53 denotes a parasitic diode between the p-well and the n-well of the thyristor and has the same function as that of the parasitic diode 17 in FIG. 1.

As a modification of the protection circuit 1B shown in FIG. 9, a configuration in which an output of the CMOS inverter 12 is supplied only to the n-channel type MOS transistor 51 may be also employed.

Figure 10:
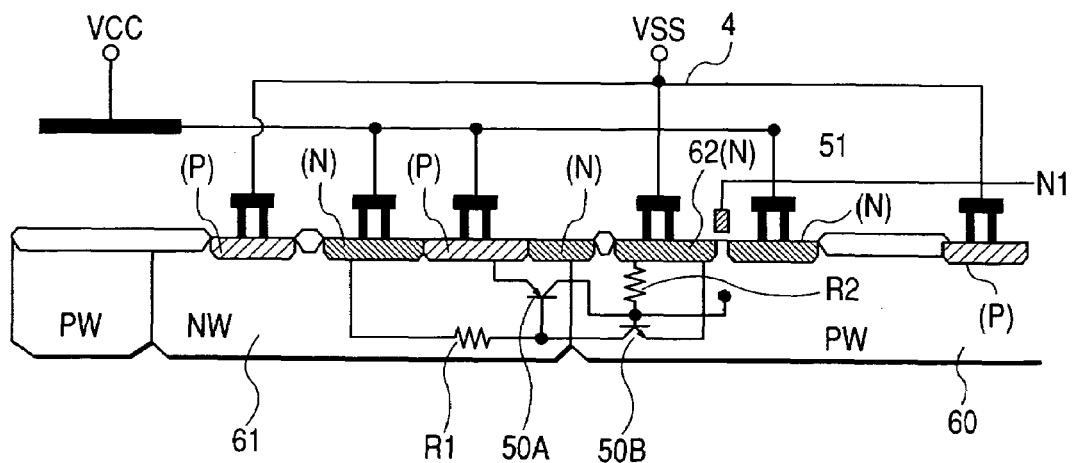
FIG. 10 is a cross section of a device structure of the thyristor.

FIG. 10 is a cross section showing a device structure of the thyristor. The MOS transistor 51 is formed in a p-type well region (PW) 60, and the thyristor 50 is formed in the p-type well region 60 and the n-type well region (NW) 61.

In the thyristor, in contrast to a voltage (turn-on voltage) across the anode and the cathode for turning on the thyristor, it is sufficient that a voltage to be applied to the trigger electrode to thereby turn on the thyristor is higher than a hold voltage as the minimum voltage for maintaining the turn-on state of the thyristor to a certain extent. For example, when a high voltage is applied to the power source line 3, the MOS transistor 51 promptly flows the channel current by the MOS channel current and the parasitic bipolar transistor current. The channel current of the MOS transistor 51 flows in the ground line 4 via a resistor R2. By the passage of the current through the resistor R2, the potential of the base (p-type well region 60) of the transistor 50B increases, the base and the emitter (n-type diffusion layer 62) of the transistor 50B are sequentially biased, and the transistor 50B is turned on. Consequently, current flows in a resistor R1 of the transistor 50A, the potential of the base (n-type well region 61) of the transistor 50A decreases, the base and the emitter of the transistor 50A (p-type well region 60, that is, the base of the transistor 50B) are sequentially biased, and the transistor 50A is turned on. Consequently, the high voltage is released to the ground line 4 via the thyristor 50. On the other hand, when the high voltage is applied to the ground line 4, the surge is absorbed by the parasitic diode 53.

As described above, the MOS transistor 51 in which the p-type well region 60 is biased to the gate voltage is also used as a trigger transistor for turning on the thyristor 50. When a high voltage generated by ESD is applied and current starts flowing into the MOS transistor 51 for the first time, it acts the trigger electrode of the thyristor 50 to turn on the thyristor 50, and high voltage discharge via the thyristor 50 starts. In the configuration, a power source voltage VCC supplied to the power source line 3 in the normal state has to be lower than the hold voltage of the thyristor 50. The invention, therefore, is applied to a semiconductor integrated circuit of a low voltage power source, in which the power source voltage is lower than the hold voltage of the thyristor 50. With the technique, the speed of the clamping operation for fluctuations in high voltage in a semiconductor integrated circuit with a low-voltage power source can be increased.

Figure 11:
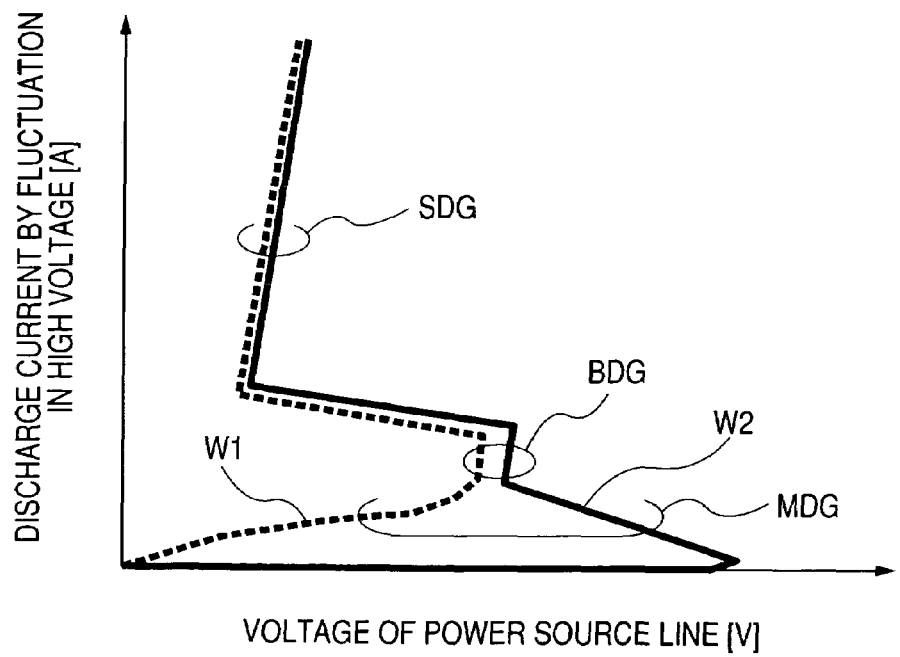
FIG. 11 is a characteristic diagram illustrating discharge current characteristics of the MOS transistor and the thyristor.

FIG. 11 shows discharge current characteristics obtained by the MOS transistor 51 and the thyristor 50. The vertical axis indicates discharge current and the horizontal axis indicates voltage of the power source line. W1 indicates a discharge characteristic obtained when an output of the CMOS inverter 12 is applied to the gate of the trigger MOS transistor 51 and the well region of the trigger MOS transistor 51 is biased with the gate voltage. W2 indicates a discharge characteristic obtained when a circuit form (not shown) in which the gate of the trigger MOS transistor 51 is fixed to the source is employed. The portion of a waveform MDG indicates a discharge current characteristic caused by a MOS channel current which responds to a gate input of the MOS transistor 51. The portion of a waveform BDG indicates a discharge current characteristic caused by a bipolar discharge by a parasitic bipolar of the MOS transistor 51. SDG indicates a discharge current characteristic after turn-on of the thyristor.

By using the thyristor 50, not a MOS transistor, as the discharge element in the final stage in the protection circuit and disposing the MOS transistor 51 using the common p-type well region 60 adjacent to the thyristor 50, an ESD surge is passed by the MOS transistor for the first time. After that, when the clamp voltage becomes about 2V or higher, a surge can be passed by the adjacent thyristor 50. As a result, the ESD surge (voltage at an undesirable level) can be clamped by a voltage (the clamp voltage in the thyristor operation is about 2V) lower than a clamp voltage (about 5V in a 3.3V device) of a drain-source horizontal type parasitic bipolar of the MOS transistor 13 in FIGS. 1 and 6.

Figure 12:
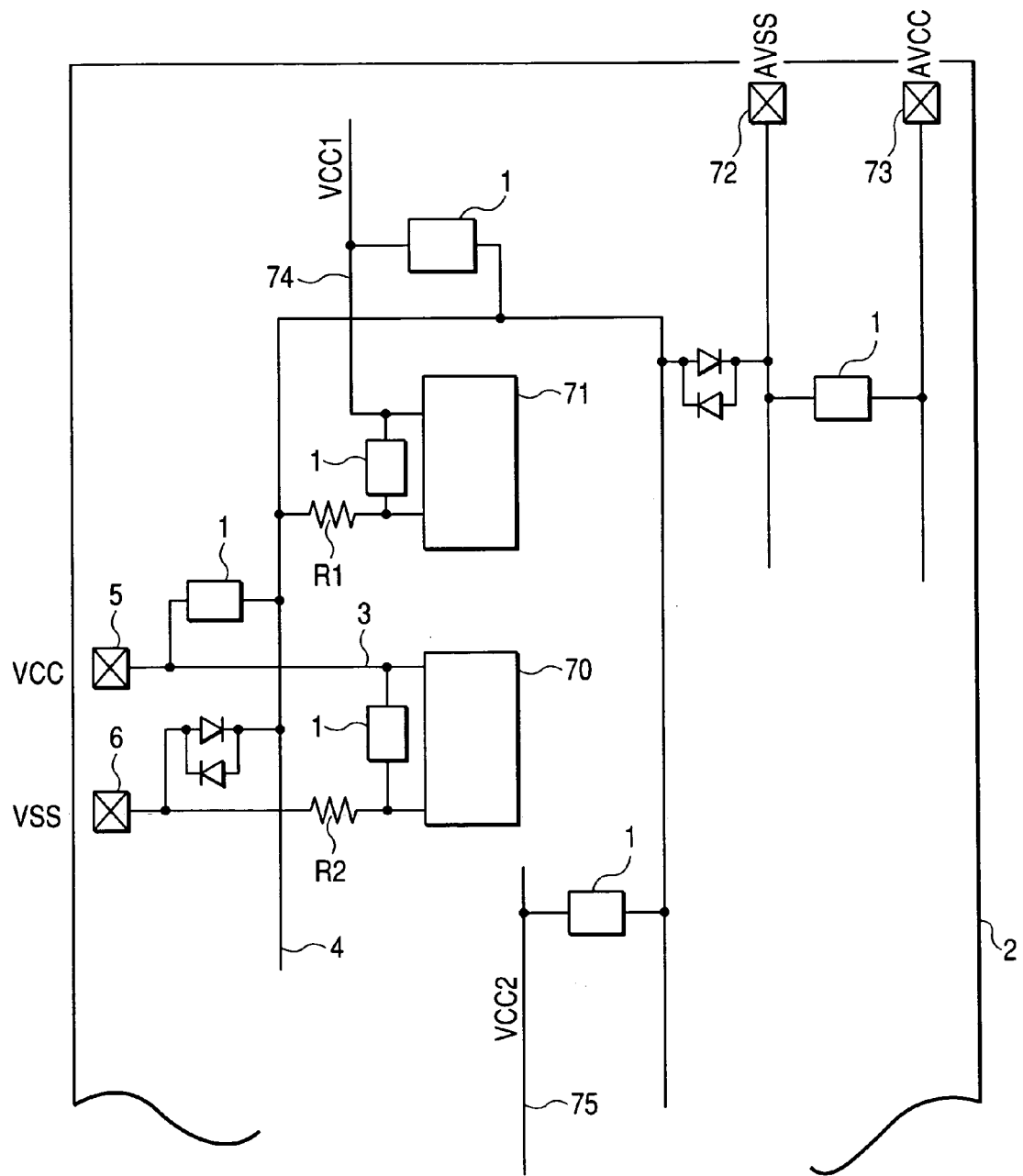
FIG. 12 is a diagram illustrating a power source net of a protection circuit against a high-voltage surge in a semiconductor integrated circuit.

FIG. 12 illustrates a power source net of the protection circuit against a high voltage surge in a semiconductor integrated circuit. The protection circuits 1 are disposed close to the power source pad 5, the ground pad 6, and a plurality of predetermined circuit modules 70 and 71. The predetermined circuit module is a circuit module in which, for example, a wiring resistor to an external ground pad is connected to a relatively large ground line. Wiring resistors are representatively shown by R1 and R2. The protection circuit 1 is similarly disposed for each of a power source pad 73 for analog signal and a ground pad 72. The protection circuit 1 is similarly provided for power source lines 74 and 75 of internal power sources VCC1 and VCC2 formed on the basis of the external power source VCC. It is desirable to dispose the protection circuits 1 as many as possible in the chip area. Even if a surge is applied on an internal power source line, a high voltage can be released to the ground pad 6 via the protection circuit 1 and the main ground line 4.

The above-described protection circuit can obtain the following effects.

By short-circuiting the gate of the clamp MOS transistor and the ground line with high resistance, the clamping operation of the protection circuit can be prevented from being erroneously performed due to power source noise.

By biasing the substrate region of the clamp MOS transistor on the basis of the voltage at the connection node between the resistor and the capacitor connected in series between the power source line and the ground line, the clamp voltage can be decreased, and the clamping operation can be performed at higher speed.

By disposing the thyristor and the MOS transistor in parallel in the final stage of the clamp circuit, the speed of clamping for fluctuations in high voltage in the semiconductor integrated circuit operated with low voltage can be increased.

Since the high voltage fluctuations can be canceled with a lower clamp voltage, resistance to high voltage fluctuations of the semiconductor integrated circuit can be improved. Since the discharge capability of the protection circuit for the high voltage fluctuations can be improved, resistance to the high voltage fluctuations, necessary for the semiconductor integrated circuit can be satisfied by an area smaller than that of the conventional technique. Moreover, the area of the semiconductor integrated circuit can be reduced and the cost can be reduced.

Although the inventions achieved by the inventors herein have been concretely described above on the basis of the embodiments, obviously, the invention is not limited to the embodiments but can be variously modified without departing from the gist.

For example, in FIG. 1, only one of ground bias of the gate input for the clamp MOS transistor 13 and bias of the well region with the gate input voltage of the clamp MOS transistor 13 may be employed. In the configuration of FIG. 6, pull-down of the gate input and the well bias to the ground line can be omitted.

What is claimed is:

1. A semiconductor integrated circuit having a protection circuit for protection against a fluctuation in high voltage between a power source line and a ground line,
    wherein the protection circuit includes:
    a first resistor and a capacitor connected in series between the power source line and the ground line,
    a first inverter having an input connected between the first resistor and the capacitor,
    a MOS transistor having a gate electrode that receives an output of the first inverter and a drain electrode and a source electrode which are connected to the power source line and the ground line, respectively, the gate electrode of the MOS transistor being connected to the ground line via a second resistor, and
    a second inverter having an input connected between the first resistor and the capacitor,
    wherein an output of the second inverter is connected to a substrate region in which the MOS transistor is formed and to the ground line via a third resistor.

2. A semiconductor integrated circuit having a protection circuit for protection against a fluctuation in high voltage between a power source line and a ground line,
    wherein the protection circuit includes:

a first resistor and a capacitor connected in series between the power source line and the ground line,
an inverter having an input connected between the first resistor and the capacitor, and
a MOS transistor having a gate electrode that receives an output of the inverter and a drain electrode and a source electrode which are connected to the power source line and the ground line, respectively, the gate electrode of the MOS transistor being connected to the ground line via a second resistor, and
a thyristor having an anode and a cathode connected between the power source line and the ground line, and having a trigger electrode connected to the gate electrode of the MOS transistor.

3. A semiconductor integrated circuit having a protection circuit for protection against a fluctuation in high voltage between a power source line and a ground line,
wherein the protection circuit comprises:
a first resistor and a capacitor connected in series between the power source line and the ground line;
a first inverter having an input directly connected between the first resistor and the capacitor;
a MOS transistor having a gate electrode that receives an output of the first inverter and a drain electrode and a source electrode which are connected to the power source line and the ground line, respectively; and
a second inverter having an input directly connected between the first resistor and the capacitor, and having an output connected to a substrate region in which the MOS transistor is formed.

4. A semiconductor integrated circuit comprising a protection circuit for protection against a fluctuation in high voltage between a power source line and a ground line,
wherein the protection circuit includes:
a first resistor and a capacitor connected in series between the power source line and the ground line;
an inverter having an input connected between the first resistor and the capacitor;
a MOS transistor having a gate electrode and a substrate electrode that receive an output of the inverter, and a drain electrode and a source electrode which are connected to the power source line and the ground line, respectively; and
a thyristor having an anode and a cathode which are connected between the power source line and the ground line, and a trigger electrode which is connected to the gate electrode of the MOS transistor.

5. A semiconductor integrated circuit according to claim 4, wherein the protection circuit is disposed between the power source line near an external power source pad and the ground line near an external ground pad.

6. A semiconductor integrated circuit according to claim 5, further including a plurality of protection circuits, including said protection circuit, and
wherein one of the protection circuits is disposed near each of a plurality of predetermined circuit modules, between the power source line and the ground line.

7. A semiconductor integrated circuit according to claim 5, wherein the power source line provides an internal power source voltage, and
wherein the protection circuit is disposed between the power source line that provides the internal power source voltage, which is generated based on an external power source voltage, and the ground line.

8. A semiconductor integrated circuit according to claim 5, further comprising an input protection circuit for protection against a fluctuation in high voltage between an external input/output pad and an input circuit.

9. A semiconductor integrated circuit comprising:
a first line;
a second line; and
a protection circuit which is connected between the first and second lines and operates when a potential difference between the first and second lines becomes a predetermined value or larger,
wherein the protection circuit includes:
a first resistive element and a capacitive element connected in series between the first and second lines;
an inverter having an output terminal and an input terminal, the input terminal being connected between the first resistive element and the capacitive element;
a MOS transistor having a gate electrode connected to the output terminal of the inverter, a substrate connected to the gate electrode, a drain electrode connected to the first line, and a source electrode connected to the second line; and
a thyristor having an anode connected to the first line, a cathode connected to the second line, and a trigger electrode connected to the gate electrode of the MOS transistor.

10. A semiconductor integrated circuit according to claim 9, wherein the protection circuit further includes a second resistive element connected between the gate electrode of the MOS transistor and the second line.

* * * * *